United States Patent [19]

Stein et al.

[11] Patent Number: 4,889,573
[45] Date of Patent: Dec. 26, 1989

[54] METHOD OF FORMING A PATTERN OF CONDUCTOR RUNS ON A SHEET OF DIELECTRIC MATERIAL

[75] Inventors: William W. Stein, Beaverton; Lawrence J. Miller, Portland, both of Oreg.

[73] Assignee: Tektronix, Inc., Beaverton, Oreg.

[21] Appl. No.: 197,484

[22] Filed: May 23, 1988

[51] Int. Cl.⁴ .............................................. C03B 29/00
[52] U.S. Cl. ....................................... 156/89; 156/233; 156/234; 156/272.8; 219/216
[58] Field of Search .............. 156/89, 233, 234, 272.8; 219/216

[56] References Cited

U.S. PATENT DOCUMENTS

| | | | |
|---|---|---|---|
| 2,747,977 | 5/1956 | Eisler | 156/234 |
| 2,776,235 | 1/1957 | Peck | 156/234 |
| 3,770,529 | 11/1973 | Anderson | 156/272.8 |
| 4,215,170 | 7/1980 | Villaprinyo Oliva | 156/234 |
| 4,465,538 | 8/1984 | Schmoock | 156/234 |
| 4,597,815 | 7/1986 | Nakamura | 156/234 |
| 4,710,253 | 12/1917 | Soszek | 156/272.8 |

*Primary Examiner*—Thurman K. Page
*Assistant Examiner*—P. J. Ryan
*Attorney, Agent, or Firm*—John D. Winkelman; John Smith-Hill

[57] ABSTRACT

A pattern of conductor runs is formed on a sheet of dielectric material using a carrier foil having a coating material adhered to one main surface thereof. The coating material contains particles of metal. The carrier foil is placed with its coated surface in contact with the sheet. The coating material is detached from the carrier foil over selected areas of its coated surface, and the detached coating material is adhered to the sheet.

14 Claims, 1 Drawing Sheet

METHOD OF FORMING A PATTERN OF CONDUCTOR RUNS ON A SHEET OF DIELECTRIC MATERIAL

BACKGROUND OF THE INVENTION

This invention relates to a method of forming a pattern of conductor runs on a sheet of dielectric material.

A so-called hybrid integrated circuit comprises a sheet-form substrate of ceramic material having one or more electronic components, such as monolithic integrated circuit chips, adhered to an upper surface of the substrate. Each electronic component has at least two terminals. The substrate may be composed of multiple sheets of ceramic material, secured together by sintering. Conductor runs are formed on the upper surface of each sheet. The conductor runs on each sheet interconnect contact pads on that sheet. A contact pad on the upper sheet may be wire bonded to a terminal of an electronic component, connected to a contact pad of one of the lower sheets through a via in the upper sheet (and possibly one or more vias in the lower sheet(s)), or connected to a conductor run of a printed circuit board. A contact pad on a lower sheet may be connected to a contact pad of another sheet through one or more vias.

It is known to use a screen printing process for providing a desired pattern of conductor runs on a ceramic sheet. In this process, a conductive ink is printed onto the ceramic sheet when it is in the unfired, or green, state. The green ceramic sheet comprises alumina powder in a matrix of an organic binder material, such as the material sold by Monsanto Company under the trademark BUTVAR 60, and is flexible and quite tough. The ink comprises a suspension of tungsten powder in an organic vehicle, and the pattern is defined by conventional screen printing techniques. After printing, the green ceramic sheet is heated to a temperature of about 800° C. in air in order to burn off the organic binder material and the organic vehicle, which decompose into carbon dioxide and water, and is then fired at a temperature of about 1700° C. in an atmosphere of hydrogen. During the firing operation, the tungsten is sintered to the ceramic material.

This conventional process is not suitable for manufacture of a small number of sheets, such as might be required for prototyping a hybrid circuit. In particular, it is not economical to manufacture a printing screen if only a few sheets are to be printed.

It is known to form a visually-distinct pattern on a receiver sheet made of paper by placing carbon paper, which comprises a carrier foil having a pigment-laden wax adhered to one surface thereof, with its coated surface in contact with the receiver sheet and applying pressure to the opposite surface of the foil in accordance with the desired pattern. The pigment-laden wax is detached from the carrier foil at locations at which pressure is applied and becomes attached to the receiver sheet.

A thermal wax printer is known in which a receiver sheet is passed between a back-up drum and a print head comprising a linear array of resistors. A transfer tape, comprising a carrier foil having a coating of pigment laden wax on one surface thereof, is positioned between the receiver sheet and the print head, with the wax towards the receiver sheet. As the sheet is advanced between the back-up drum and the transfer tape, the resistors are selectively activated. When a resistor receives current, it becomes hot and the wax on the area of tape that is immediately beneath the resistor is transferred to the receiver sheet. By appropriate selection of the resistors that are stimulated in relation to the advancement of the receiver sheet, a desired pattern of pigment-laden wax is formed on the receiver sheet.

SUMMARY OF THE INVENTION

A preferred embodiment of the present invention is a method of forming a pattern of conductor runs on a sheet of dielectric material. The method comprises providing a carrier foil having a coating material adhered to one main surface thereof. The coating material contains particles of metal. The carrier foil is placed with its coated surface in contact with the sheet. The coating material is detached from the carrier foil over selected areas of its coated surface, and the detached coating material is adhered to the sheet.

BRIEF DESCRIPTION OF DRAWING

For a better understanding of the invention, and to show how the same may be carried into effect, reference will now be made, by way of example, to the accompanying drawing, in which.

DETAILED DESCRIPTION

Figure 1:
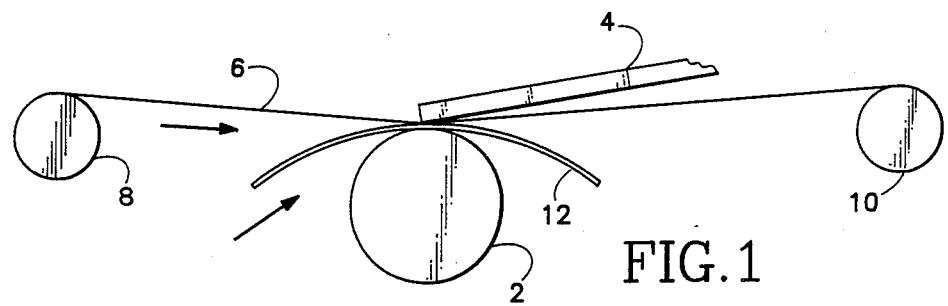
FIG. 1 is a side view of a printer that may be used in carrying out a method embodying the present invention.

The printer shown in FIG. 1 comprises a back-up drum 2 and a thermal print head 4. A coated transfer tape 6 is fed between the back-up drum 2 and the thermal print head 4 from a supply roll 8 to a take up roll 10. A receiver sheet 12 is positioned between the transfer tape 6 and the back-up drum 2 and is fed in the same direction as the transfer tape. The thermal print head comprises a support member having a linear array of thin-film resistors on the surface that engages the transfer tape. The print head extends over the entire width of the transfer tape, and exerts a slight contact pressure on the transfer tape, and hence the receiver sheet, over the entire width of the transfer tape.

The receiver sheet is made of green ceramic, e.g. powdered alumina in a matrix of the material sold under the trademark BUTVAR 60. The sheet is between about 12 mil and 24 mil thick (one mil is 0.001 inch, or 0.0254 mm), and is fairly flexible and quite tough.

The transfer tape comprises a carrier foil of 0.5 mil condenser paper and a coating of 5 $\mu$m tungsten powder in a wax matrix. The coating is on the surface of the carrier foil that is towards the receiver sheet.

The thermal print head is driven in conventional fashion, but the image represented by the signal that is used to drive the thermal print head is generated by a computer aided design system and represents the pattern of conductor runs desired on a layer of a multilayer ceramic hybrid circuit. The operation of the thermal print head causes an image of the pattern of conductor runs to be transferred from the transfer tape to the green ceramic sheet.

Alternatively, the image may be transferred from the transfer tape to the green ceramic sheet by application of pressure, e.g. by use of an impact printer or a hand-held stylus. In either case, a green ceramic sheet having a pattern of tungsten-laden wax runs on one surface is formed. The green ceramic sheet is then heated to about 800° C. in an atmosphere of air, and the wax and the organic binder material decompose, and is fired at about 1700° C. in an atmosphere of hydrogen. During firing, the tungsten particles are sintered to the ceramic. Thus a ceramic sheet having a pattern of conductor runs is generated without having to use screen printing techniques.

The width, length and thickness of a conductor run control its resistance. Therefore, resistors can be formed on the ceramic sheet by defining narrow, long, thin runs of tungsten-laden wax.

Figure 2:
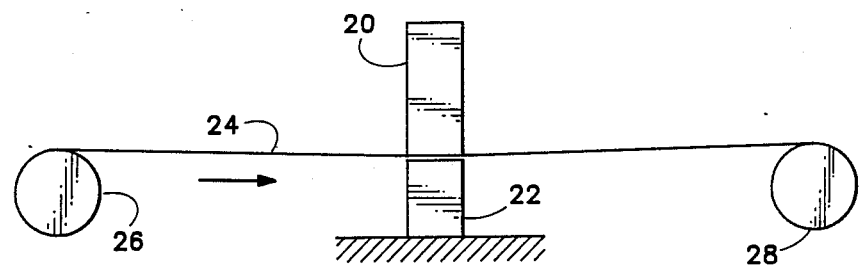
FIG. 2 is a side view of apparatus for forming a transfer tape.

The coating material is applied to the carrier foil using the apparatus shown in FIG. 2. A block 20 of tungsten-laden wax, which may be made in the manner described in Example 1, 2 or 3, is placed over an electrically heatable shoe 22, and a carrier foil 24 of 0.5 mil condenser paper is fed between the block 20 and the shoe 22 from a supply roll 26 to a take up roll 28. The heat produced by the shoe 22 forms a film of molten wax where the block 20 engages the foil 24, and as the foil is advanced the molten wax, with tungsten particles suspended therein, is wiped from the block and forms a coating on the upper surface of the foil. The thickness of the wax coating depends on both the feed speed of the carrier foil and the temperature of the shoe. In order to avoid nonuniformity in the thickness of the wax coating along the length of the resulting transfer tape, the feed speed of the carrier foil and the temperature of the shoe are maintained constant. The thickness of the coating may be altered by changing the feed speed of the carrier foil.

EXAMPLE 1

40 g paraffin wax, 8 g carnuba wax, 16 g bees wax, 60 ml hydrocarbon solvent, such as the material sold by Exxon Company under the trademark Isopar H, and 100 g tungsten powder having particle size of 5 $\mu$m were placed in a 3 inch (7.62 cm) diameter ceramic ball mill having a gross volume of 200 ml with 25 tungsten carbide balls each having a mass of 8.6 g. The mill was driven at about 60 rpm and its contents were heated to about 70° C. using a quartz-halogen bulb. The milling continued for 72 hours, in order to ensure that all agglomerations of tungsten particles were broken down and that each particle was fully coated with wax.

The hydrocarbon solvent was used to facilitate the milling operation. If the material in the ball mill had contained only the waxes and the tungsten powder, the milling would have to have taken place at a substantially higher temperature in order for the waxes to melt so that they could mix and form the desired coating on the tungsten particles. In order to remove the solvent when the milling was completed, the contents of the mill were transferred to an evaporation vessel and warmed. Warming continued until all solvent was removed.

During the warming, additional wax may be added to the contents of the evaporation vessel in order to adjust the properties of the final wax mixture. For example, it is desirable that the wax have a fairly low viscosity when in the molten state, a sharp melting point so that the molten wax will freeze rapidly, and be rigid when in the solid state. The properties of waxes are well understood, and a person skilled in the art would be able to adjust the composition of the wax mixture to achieve the desired combination of properties.

The molten material was poured into a rectangular mold, where it solidified as a block of tungsten-laden wax. Prior to pouring, the molten material was cooled to a few degrees above its liquid point and the mold was chilled. The purpose of these measures was to ensure that the wax would solidify rapidly, in order to minimize settling of the tungsten particles. Nevertheless, settling of the tungsten particles to the bottom of the mold cannot be avoided completely. In order to avoid changes in the composition of the coating along the length of the transfer tape, the block 20 is oriented in the apparatus of FIG. 2 with the surface that was at the bottom of the mold extending transversely of the foil 24 and downstream with respect to the direction of movement of the foil.

EXAMPLE 2

30 g microcrystalline wax sold under the designation ML 445 by the Sonneborn Division of Witco Corp., New York, New York, 60 g carnuba wax, 60 g paraffin wax, 6 g stearic acid, and 2 ml plasticizer were mixed together, and 100 g of this mixture was combined with 200 g of 5 $\mu$m tungsten powder and ball milled for 48 hours. The stearic acid, which acts as a plasticizer, and the liquid plasticizer were used in lieu of the solvent of Example 1. The plasticizers provide a wax composition that is flowable below the normal melting point of the waxes without need to use a liquid solvent, which must be evaporated. Except as stated, the procedure was the same as in Example 1.

EXAMPLE 3

Resistors made using the compositions described in Examples 1 and 2 were not satisfactory, because they were not reproducible. It was found that this was because the tungsten-laden wax that was transferred to the green ceramic sheet did not contain sufficient tungsten to form a conductive path having consistent resistivity when the path was narrow. In order to increase the concentration of tungsten in the wax, a composition was formed by adding 94 g of 5 $\mu$m tungsten powder to 140 g of the material prepared in accordance with Example 2, resulting in the coating material having a composition of 80 weight percent tungsten and 20 weight percent wax. This material was ball milled at about 80° C. for about 100 hours with silicon carbide balls. Resistors formed using this composition had consistent electrical properties.

It will be appreciated that the invention is not restricted to the particular methods that have been described, and that variations may be made therein without departing from the scope of the invention as defined in the appended claims and equivalents thereof. For example, the invention is not limited to use with a paper carrier foil or to use of tungsten as the conductive material. The metal that is used must have a melting point that is higher than the temperature at which the ceramic is fired, and must not be oxidized during the firing operation. If a low temperature firing ceramic is used, metals such as gold, silver and copper may be used instead of tungsten.

We claim:

1. A method of forming a pattern of conductor runs on a receiver sheet of dielectric material, comprising:
    (a) providing a transfer sheet comprising a carrier foil having a metal-containing coating adhered to one main face thereof, and a receiver sheet of green ceramic material,
    (b) placing the transfer sheet with the coating in contact with the receiver sheet, and (c) detaching the coating material from the carrier foil over selected areas of said one main face thereof and adhering the detached coating material to the receiver sheet.

2. A method according to claim 1, further comprising firing the ceramic material after the detached coating material has been adhered to the receiver sheet.

3. A method according to claim 1, wherein the coating material comprises particles of metal embedded in a matrix of organic material.

4. A method according to claim 3, wherein the organic material comprises a wax.

5. A method according to claim 4, further comprising heating the green ceramic material in an atmosphere containing oxygen after the detached coating material has been adhered to the receiver sheet, whereby the wax decomposes, and firing the green ceramic material, whereby the metal bonds to the ceramic.

6. A method according to claim 1, wherein step (a) is performed by mixing particles of metal with a wax material in a liquid state, casting the liquid wax material with the metal particles suspended therein to form a solid, and applying a coating of the solid to said carrier foil.

7. A method according to claim 1, wherein step (c) is performed by applying pressure to the transfer sheet over an extended area thereof and applying heat locally to the transfer sheet.

8. A method according to claim 1, wherein step (c) is performed by locally applying pressure to the transfer sheet.

9. A method of forming a pattern of conductor runs on a receiver sheet of dielectric material, comprising:

(a) providing a transfer sheet comprising a carrier foil having a coating adhered to one main face thereof, said coating comprising particles of metal embedded in a matrix of wax, (b) placing the transfer sheet with the coating in contact with the receiver sheet, and (c) detaching the coating material from the carrier foil over selected areas of said one main face thereof and adhering the detached coating material to the receiver sheet.

10. A method according to claim 9, wherein the receiver sheet is green ceramic material, and the method further comprises firing the ceramic material after the detached coating material has been adhered to the receiver sheet.

11. A method according to claim 9, further comprising heating the receiver sheet in an atmosphere containing oxygen after the detached coating material has been adhered to the receiver sheet, whereby the wax decomposes.

12. A method according to claim 9, wherein step (a) is performed by mixing particles of metal with a wax material in a liquid state, casting the liquid wax material with the metal particles suspended therein to form a solid, and applying a coating of the solid to said carrier foil.

13. A method according to claim 9, wherein step (c) is performed by applying pressure to the transfer sheet over an extended area thereof and applying heat locally to the transfer sheet.

14. A method according to claim 9, wherein step (c) is performed by locally applying pressure to the transfer sheet.

* * * * *